United States Patent
Peter et al.

(10) Patent No.: US 9,633,853 B2
(45) Date of Patent: Apr. 25, 2017

(54) METHOD FOR FORMING AN ELECTRICAL CONTACT

(71) Applicant: IMEC VZW, Leuven (BE)

(72) Inventors: Antony Premkumar Peter, Leuven (BE); Marc Schaekers, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/957,989

(22) Filed: Dec. 3, 2015

(65) Prior Publication Data
US 2016/0163648 A1 Jun. 9, 2016

(30) Foreign Application Priority Data
Dec. 8, 2014 (EP) .................................. 14196804

(51) Int. Cl.
*H01L 21/24* (2006.01)
*H01L 23/535* (2006.01)
(Continued)

(52) U.S. Cl.
CPC ........ *H01L 21/244* (2013.01); *H01L 21/0262* (2013.01); *H01L 21/02425* (2013.01);
(Continued)

(58) Field of Classification Search
CPC ......... H01L 21/02365; H01L 21/02425; H01L 21/2257; H01L 21/28052; H01L 21/2807; H01L 21/32051; H01L 21/32053; H01L 21/823443; H01L 21/53209; H01L 21/0245; H01L 21/02614; H01L 21/02617; H01L 21/0262; H01L 21/02636;
(Continued)

(56) References Cited

U.S. PATENT DOCUMENTS 7,358,188 B2 * 4/2008 Basceri ............ H01L 21/76823
257/E21.507
7,517,765 B2   4/2009 Brunco et al.
(Continued)

FOREIGN PATENT DOCUMENTS

WO    2013/171235 A1   11/2013

OTHER PUBLICATIONS

Brunco, D. P. et al., "Observation and Suppression of Nickel Germanide Overgrowth on Germanium Substrates With Patterned SiO2 Structures", Electrochemical and Solid-State Letters, vol. 11, No. 2, 2008, pp. H39-H41.
(Continued)

*Primary Examiner* — Eduardo A Rodela
(74) *Attorney, Agent, or Firm* — McDonnell Boehnen Hulbert & Berghoff LLP

(57) ABSTRACT

A method for forming an electrical contact to a semiconductor structure is provided. The method includes providing a semiconductor structure, providing a metal on an area of said semiconductor structure, wherein said area exposes a semiconductor material and is at least a part of a contact region, converting said metal to a Si-comprising or a Ge-comprising alloy, thereby forming said electrical contact on said area, wherein said converting is done by performing a vapor-solid reaction, whereby said semiconductor structure including said metal is subjected to a silicon-comprising precursor gas or a germanium-comprising precursor gas.

18 Claims, 13 Drawing Sheets

(51) Int. Cl.
   *H01L 21/768* (2006.01)
   *H01L 23/532* (2006.01)
   *H01L 29/08* (2006.01)
   *H01L 21/02* (2006.01)
   *H01L 21/205* (2006.01)
   *H01L 21/285* (2006.01)

(52) U.S. Cl.
   CPC ......... *H01L 21/2053* (2013.01); *H01L 21/24* (2013.01); *H01L 21/28518* (2013.01); *H01L 21/76805* (2013.01); *H01L 21/76843* (2013.01); *H01L 21/76856* (2013.01); *H01L 21/76886* (2013.01); *H01L 21/76895* (2013.01); *H01L 23/535* (2013.01); *H01L 23/53209* (2013.01); *H01L 29/0847* (2013.01); *H01L 2924/0002* (2013.01)

(58) Field of Classification Search
   CPC ......... H01L 21/02639; H01L 21/02645; H01L 21/20; H01L 21/205; H01L 21/2053; H01L 21/24; H01L 21/244
   See application file for complete search history.

(56) References Cited

U.S. PATENT DOCUMENTS

| | | |
|---|---|---|
| 7,972,911 B1 | 7/2011 | Carron et al. |
| 8,580,686 B1 | 11/2013 | Deniz |
| 2003/0025206 A1* | 2/2003 | Derraa ............. H01L 21/28556 257/758 |
| 2007/0166974 A1 | 7/2007 | Uchino et al. |
| 2007/0190768 A1* | 8/2007 | Sato ............... H01L 21/28194 438/592 |
| 2007/0197029 A1* | 8/2007 | Halimaoui ........ H01L 21/02068 438/658 |
| 2009/0269915 A1* | 10/2009 | Jung ................ H01L 21/28518 438/586 |
| 2009/0294871 A1* | 12/2009 | Besser ............. H01L 21/26506 257/384 |
| 2010/0330764 A1* | 12/2010 | Akiyama ........... H01L 21/2686 438/308 |
| 2013/0277752 A1* | 10/2013 | Glass ............. H01L 21/823821 257/369 |
| 2014/0113425 A1* | 4/2014 | Liu ................ H01L 21/823412 438/302 |
| 2014/0167264 A1 | 6/2014 | Besser et al. |
| 2014/0175554 A1* | 6/2014 | Loubet ........... H01L 21/823431 257/368 |

OTHER PUBLICATIONS

Partial European Search Report, European Patent Application No. 14196804.0, dated Jun. 16, 2015.
European Search Report, European Patent Application No. 14196804.0, dated Oct. 13, 2015.
Peter, Antony P. et al., "Ultrathin NiGe Films Prepared Via Catalytic Solid—Vapor Reaction of Ni with GeH4", ACS Applied Materials & Interfaces, vol. 5, 2013, pp. 9605-9614.
Peter, Antony Premkumar et al., "Growth Evolution and Characterization of Ultra-Thin CoGe2 Films Synthesized Via a Catalytic Solid—Vapour Reaction Technique", J. Mater. Chem., vol. 2, 2014, pp. 1904-1912.
Premkumar, P. Antony et al., "Low Temperature Chemical Vapour Synthesis of Cu3Ge Thin Films for Interconnect Applications", Microelectronic Engineering, vol. 120, 2014, pp. 246-250.

* cited by examiner

METHOD FOR FORMING AN ELECTRICAL CONTACT

CROSS-REFERENCE

This application claims priority from European Patent Application No. EP 14196804.0, filed Dec. 8, 2014, which is incorporated by references in its entirety.

TECHNICAL FIELD OF THE INVENTION

The present invention is related to the field of contact formation. More specifically, it is related to a method for forming an electrical contact to a semiconductor structure, whereby a metal-semiconductor alloy is used. The present invention also relates to semiconductor devices comprising electrical contacts obtained thereby.

BACKGROUND OF THE INVENTION

The effort to keep up with CMOS scaling, which relates to reducing the size of transistors in pursuit of Moore's Law, has led semiconductor industry in search for new transistor designs and use of alternative materials. In terms of design improvement, multi gate field effect transistors (MUGFET), such as FinFETs and Tri-gate FETs, are one of the strategies implemented. A MUGFET is a term used to describe a metal oxide semiconductor field effect transistor (MOSFET) incorporating more than one gate into a single device. A FinFET refers to a device in which the conducting channel is formed by a thin fin, which forms the body of the device. In terms of materials there is a great deal of interest in the use of germanium (Ge) as the channel material, instead of the state of the art silicon, due to its high bulk electron and hole mobility to boost up the transistor performance.

It is well known that reducing transistor sizes requires a minimization of series resistance towards the channel of the transistor to achieve high performance. This series resistance is composed of overlap resistance, extension resistance and contact resistance. In this respect, reducing contact resistance is one of the key parameters that will lead to reduction in series resistance thus achieving high performance.

One of the ways to reduce contact resistance is to convert the Ge present in the source and drain regions to low resistive nickel-germanide films by a well-known salmanide (self-aligned germanide) process (U.S. Pat. No. 7,517,765 B2). Salmanide process involves reacting thin films of deposited Ni with the underlying Ge substrate in a two-step rapid thermal (RTP) process. The first RTP step is usually done in the temperature range of 240° C. to 270° C., while the second RTP step is done in the temperature range of 300° C. to 400° C. In between the two RTP processes, unreacted or excess Ni is removed selectively by wet etch using acid mixtures as known to person skilled in the art. Salmanide process is a solid-solid reaction between deposited Ni and Ge and as such it involves consumption of Ge during the process of formation of nickel-germanide films as a result of rapid thermal process.

This approach faces several challenges as CMOS scaling continues. Firstly, the consumption of Ge during the germanidation reaction jeopardizes the geometry of the source and/or drain regions thus degrading the junction performances due to the dopants being pushed down to the Ge layers. Furthermore, the Ge material consumption results in formed germanide extending deeper into the Ge than the junction thereby forming short-circuit to underlying substrate. In order to overcome this challenge a layer of Ti is deposited in between two layers of co-sputtered Ni and Ge and a single RTP is done (U.S. Pat. No. 8,580,686 B1). However, such efforts have been silent concerning the challenge of reducing contact resistance.

Secondly, the applied etch chemistries, often, attack the formed metal germanide or Ge layers during the unreacted metal removal process step. Applying a single RTP process, in order to eliminate the use of selective etching process, at higher temperatures (≥300° C.) is a solution to overcome this challenge as known to persons skilled in the art. However, it results in large scale voiding due to enhanced Ge diffusion (Brunco et. al., Electrochemical and Solid State Letters, 11(2) (2008)). This can lead to higher leakage current and thereby degrading device performance, which is undesirable.

Hence, there exists a need in the art for a method to enable formation of NiGe contacts with reduced or no Ge consumption, while offering reduced contact resistance in the absence of degradation of device performance.

SUMMARY OF THE INVENTION

It is an object of embodiments of the present invention to provide methods for forming an electrical contact to a semiconductor structure.

The above objective is accomplished by a method according to the present invention.

In a first aspect, the present invention relates to a method for forming an electrical contact to a semiconductor structure. The method comprises providing a semiconductor structure. A metal is provided on an area of this semiconductor structure. This area exposes a semiconductor material and is at least a part of a contact region. This metal is converted to a silicon comprising or a germanium comprising alloy, thereby forming the electrical contact to the semiconductor structure on this area. Converting the metal to a silicon comprising alloy or a germanium comprising alloy is done by performing a vapor-solid reaction. During this vapor-solid reaction this semiconductor structure including this metal is subjected to a silicon comprising precursor gas or a germanium comprising precursor gas.

In embodiments, this semiconductor material exposed by this area may comprise Si, Ge or may be a III-V compound semiconductor material.

In embodiments, this semiconductor structure may be a field effect transistor (FET) or an intermediate structure during the fabrication of this FET. This FET may be a multi gate FET (MUGFET). This MUGFET may be a FinFET or a tri-gate FET. If this semiconductor structure is a FinFET, a tri-gate FET or an intermediate structure during the fabrication of either of these, this exposed area may be at least a part of a contact region. This contact region is at least a part of a top surface of a source region and/or a drain region.

The inventors have found out that the formation of this electrical contact through a vapor-solid reaction makes the formation independent of the materials choice of the layer or of the (semiconductor) structure, on which this metal is deposited.

It is, thus, an advantage of embodiments of this invention that formation of the Ge comprising alloy is solely due to the reaction of this metal with Ge comprising precursor gas and that the formation of this Ge comprising alloy is independent of the choice of underlying layer or (semiconductor) structure, where upon this metal is provided.

It is, thus, an advantage of embodiments of this invention that formation of the Si comprising alloy is solely due to the reaction of this metal with Si comprising precursor gas and the formation of Si comprising alloy is independent of the choice of underlying layer or (semiconductor) structure, where upon this metal is provided.

The inventors have further observed that thanks to the vapor-solid reaction taking place between the Ge comprising precursor gas or Si comprising precursor gas and this metal, the semiconductor material, on which this metal is deposited, is not consumed.

Consumption of the semiconductor material during contact formation can degrade the junction performance due to the dopants present in the contact area being pushed down to the active layers of the semiconductor structure. Junction depth is reduced as the size of transistors are reducing. Therefore, consumption of the semiconductor structure is more critical.

Advantageously, in a method according to embodiments of the present invention, there is no consumption of the semiconductor material, on which this metal is provided, during electrical contact formation thanks to the vapor-solid reaction. Therefore, the method described above may be particularly suited for producing NiGe or NiSi electrical contacts to be used in a p-MOS and/or an n-MOS transistor.

In an embodiment, providing this metal on an area of this semiconductor structure comprises applying a pre-treatment. This pre-treatment is subsequently followed by depositing this metal. This pre-treatment is a dry pre-cleaning treatment. This dry pre-cleaning treatment is a SiCoNi treatment. This SiCoNi treatment is an in-situ pretreatment given prior to Ni deposition in the same chamber/tool, which is widely used to remove native oxide on Si substrate.

In a method according to embodiments of the present invention, providing this metal on an area of this semiconductor structure further comprises loading this semiconductor structure into a first tool. This first tool may be a deposition tool. This first deposition tool may be a physical vapor deposition (PVD) tool, sputtering tool or an atomic layer deposition (ALD) tool.

In a method according to embodiments of the present invention, this metal is nickel. Nickel is typically used for forming electrical contacts to semiconductor structures thanks to its ability to form low resistance electrical contacts.

After depositing this metal in this first tool, this semiconductor structure is loaded into a second tool. This second tool may be a deposition tool. This second deposition tool may be a chemical vapor deposition tool (CVD). After reaching a stabilized temperature between the chuck, on which this semiconductor structure is placed, and the surface of this semiconductor structure, this semiconductor structure including this metal is subjected to a Si comprising or a Ge comprising precursor gas, to thereby convert this metal into a Si comprising alloy or a Ge comprising alloy.

In a method according to embodiments of the present invention, this vapor-solid reaction is carried out at a temperature in the range of 215° C. to 350° C. This temperature corresponds to this stabilized temperature.

In preferred embodiments of the present invention, this vapor-solid reaction is carried out at a temperature in the range of 215° C. to 250° C. Preferably, this temperature is 225° C. In these embodiments, said germanium comprising precursor is $GeH_4$. This temperature corresponds to this stabilized temperature.

It is an advantage that methods according to these preferred embodiments of the present invention allow the formation of an electrical contact at a temperature in the range of 215° C. to 250° C., without the need to perform additional thermal treatment processes at temperatures higher than 250° C. This electrical contact is a Ge comprising alloy. This Ge comprising alloy is a mono-nickel-germanide (NiGe).

In alternative embodiments of the present invention, this vapor-solid reaction is carried out at a temperature in the range of 225° C. to 350° C. In these embodiments, said silicon comprising precursor is $SiH_4$. This temperature corresponds to this stabilized temperature.

It is an advantage that methods according to these alternative embodiments of the present invention allow the formation of an electrical contact at a temperature in the range of 225° C. to 350° C., without the need to perform additional thermal treatment processes at temperatures higher than 350° C. This electrical contact is a Si comprising alloy. This Si comprising alloy is a mono-nickel-silicide (NiSi).

In a method according to embodiments of the present invention NiGe or NiSi electrical contacts are produced on a fin structure comprising Si, Ge or a III-V compound semiconductor material. Such electrical contacts, particularly, NiGe electrical contacts are suited as size of transistors are reduced in an effort to keep up with CMOS scaling. This is due to the fact that NiGe contacts offer the advantage of being low resistance. Particularly, NiGe contacts produced by the method according to embodiments of the present invention offers additionally the advantage of being produced at a lower temperature than the state-of-the-art produced NiGe contacts.

According to a particular embodiment of the present invention, providing this semiconductor structure comprises providing a semiconductor substrate. This semiconductor substrate can be silicon on insulator (SOI) substrate, germanium substrate or bulk silicon substrate. A vertical semiconductor body is produced that protrudes from this semiconductor substrate. This vertical semiconductor body has a top surface and comprises said contact region on said top surface. The method further comprises defining this area on this semiconductor structure before providing this metal.

In embodiments, defining this area comprises depositing an insulating layer overlying said semiconductor structure. This insulating layer is preferably $SiO_2$. This insulating layer may also be referred to as a Pre-Metal Dielectric (PMD). A chemical mechanical planarization step is performed, thereby flattening the surface of this insulating layer and reducing the thickness to a predetermined value. A photoresist is deposited on said semiconductor structure overlying this insulating layer. A lithographic process is performed, thereby creating a patterned photoresist. A subsequent etch process is performed using this patterned photoresist as a mask layer, thereby creating a through-hole through this insulating layer. Defining this area further comprises removing this patterned photoresist by performing a strip process.

This through-hole is a contact hole.

This through-hole has sidewalls that open/expose at least this insulating layer.

This through-hole opens, at its bottom, to this area. This area is a part of this semiconductor structure.

In embodiments, this metal is provided at least on this area in this first deposition tool.

In preferred embodiments, this metal is provided on this area and on said sidewalls of this through-hole. Converting said metal to said Si-comprising alloy or said Ge-comprising alloy, thereby, forms a continuous Si-comprising alloy or a continuous Ge-comprising alloy at the sidewalls and at the bottom of this through-hole.

In embodiments, this area is a contact area and exposes at least a part of a contact region. This contact region is comprised on the top surface of this vertical semiconductor body. This contact region is at least a part of a top surface of a source region and/or a drain region. This source and/or drain region is comprised on the top part of this vertical semiconductor body. This vertical semiconductor body is a fin structure.

In an embodiment of the present invention, producing this vertical semiconductor body comprises depositing epitaxially a semiconductor material on a part of this semiconductor substrate. In a preferred embodiment, this part of this semiconductor substrate is a recess in this semiconductor substrate bounded by insulating sidewalls. These sidewalls are shallow trench isolation (STI) structures. Depositing epitaxially this semiconductor material in this recess and producing this vertical semiconductor body from this semiconductor material is known to skilled persons in the art. In an alternative embodiment, this part of this semiconductor substrate is the main surface of this substrate. This semiconductor material is deposited epitaxially to a predetermined thickness. Producing this vertical semiconductor body from this semiconductor material further comprises performing a lithographic process and performing an etch process known to skilled persons in the art.

In an embodiment this epitaxially deposited semiconductor material comprises silicon, germanium or a group III-V compound semiconductor. Preferably, this semiconductor material may be Si, SiGe, strained Ge. Preferably, this group III-V compound semiconductor may be InGaAs, GaAs or InAs.

In embodiments, this epitaxially grown vertical semiconductor body is a fin structure.

In embodiments, this vertical semiconductor body comprises Si, Ge, strained Ge or a group III-V compound semiconductor. Preferably, this group III-V compound semiconductor may be InGaAs, GaAs or InAs.

In embodiments this semiconductor substrate may be Si.

In embodiments, said area exposes said semiconductor material at the bottom of this through-hole in an insulating layer. In embodiments, after converting said metal, thus after forming said electrical contact, the method further comprises providing a contact metal in this through-hole. This contact metal fills this through-hole.

In embodiments, this electrical contact has an upper interface with this contact metal and a lower interface with this vertical semiconductor body on this area. This lower interface is a planar interface. The thickness variation of this electrical contact between this upper interface and this lower interface is less than <1 nm.

In a second aspect, this invention relates to a semiconductor device. This semiconductor device comprises a semiconductor structure. This semiconductor structure comprises a semiconductor substrate and a vertical semiconductor body protruding from this semiconductor substrate. This vertical semiconductor body is a fin structure and it has a top surface. This top surface comprises a contact region.

In embodiments, this contact region is at least a part of a top surface of a source region and/or a drain region. This source and/or drain region is comprised on the top part of this fin structure. This source region and/or drain region is doped with a dopant element as known to a person skilled in the art. This source region and drain region are separated from each other on the longitudinal axis by a gate stack. This gate stack is sandwiched between insulating spacers and it comprises a gate dielectric, a gate electrode and (optionally) a gate cap.

An insulating layer is present on and overlying this semiconductor structure. This insulating layer has a through-hole that opens at its bottom to an area. This area exposes a semiconductor material and is at least a part of this contact region. This through-hole has sidewalls that open/expose at least this insulating material. This area is a contact area and this through-hole is a contact hole. A contact metal is provided in this through-hole. A continuous mono-nickel silicide or a mono-nickel-germanide layer is present at the sidewalls and at the bottom of this through-hole, thereby forming an electrical contact on this area between this contact metal filling this through-hole and this vertical semiconductor body. At the bottom of this through-hole, this electrical contact has an upper interface with this contact metal and a lower interface with this vertical semiconductor body on this area. This lower interface is planar and the thickness variation of this electrical contact between this upper interface and this lower interface is less than 1 nm.

In embodiments, this semiconductor device may be an intermediate semiconductor device (obtained) during back end of line (BEOL) processing.

In embodiments, this vertical semiconductor body may comprise Si, Ge, strained Ge, a group III-V compound semiconductor material. This group III-V compound semiconductor material may be chosen from a list comprising InGaAs, GaAs or InAs. This vertical semiconductor body may be a fin structure.

In embodiments, this insulating layer may be pre-metal dielectric (PMD). This PMD is $SiO_2$. In embodiments, this semiconductor structure may be a field effect transistor (FET) or an intermediate structure during the fabrication of this FET. This FET may be a multi gate FET (MUGFET). This MUGFET may be a FinFET or a tri-gate FET. If this semiconductor structure is a FinFET, a tri-gate FET or an intermediate structure during the fabrication of either of these, this exposed area may be at least a part of a contact region. This contact region is at least a part of a top surface of a source region and/or a drain region.

In embodiments, this FET may be a p-MOS field effect transistor. This electrical contact comprised in this p-MOS field effect transistor is present on an area that exposes at least a part of a source and/or drain region of a vertical semiconductor body comprising Ge. This vertical semiconductor body may be made from SiGe, strained Ge or a stack of strained Ge/$Si_xGe_{1-x}$ strain relaxed buffer layer (SRB)/Si.

In embodiments, this FET may be a n-MOS field effect transistor. This electrical contact comprised in this n-MOS field effect transistor is present on an area that exposes at least a part of a source and/or drain region of a vertical semiconductor body made from Si or a III-V compound semiconductor material. This III-V compound semiconductor may be InGaAs, GaAs or InAs.

In embodiments, this invention relates to an integrated circuit comprising at least one such semiconductor device.

Advantageously, the method described may be particularly suited for producing NiGe or NiSi electrical contacts in this integrated circuit that may comprise multiple n-MOS and p-MOS field effect transistors. The method described simplifies the electrical contact formation. NiGe or NiSi electrical contacts may be formed simultaneously on p-MOS and n-MOS field effect transistors, respectively, thanks to the advantage that NiGe or NiSi formation, by the method described, is independent of the underlying layer.

If, this p-MOS and this n-MOS field effect transistor or plurality of n-MOS and p-MOS field effect transistors is/are desired to have different electrical contacts, for example NiGe on p-MOS field effect transistor and NiSi on n-MOS field effect transistor or NiGe on n-MOS field effect transistor and NiSi on p-MOS field effect transistor, then after Ni deposition, a protective layer may be deposited on this semiconductor structure. This protective layer may be SiO2, SiN, amorphous carbon or other hard mask. This protective layer is patterned and etched, to expose a first transistor area and to, thereby, leave this protective layer (only) on a second transistor area. This first transistor area is a p-MOS field effect transistor area. This second transistor area is a n-MOS field effect transistor area. Subjecting this semiconductor structure to a Ge comprising precursor gas at a temperature in the range of 215° C. to 250° C. forms NiGe electrical contact on this (exposed) first transistor area. Thereafter, this protective layer is removed from this second transistor area. Then, this semiconductor structure is subjected to a Si comprising precursor gas at a temperature in the range of 225° C. to 350° C., to thereby form NiSi electrical contact on this second transistor area.

Alternatively, after removing this protective layer from second transistor area and before subjecting this semiconductor structure to this Si comprising precursor gas, this first transistor area having NiGe electrical contact may be coated with this protective layer. Coating this first transistor area with this protective layer may comprise depositing this protective layer, patterning and etching to, thereby, leave this protective layer on this first transistor area having this already-formed NiGe electrical contact. Thereafter, this semiconductor structure is subjected to this Si comprising precursor gas, thereby forming NiSi electrical contact on this second transistor area.

In a third aspect, this invention relates to the use of a vapor-solid reaction for forming an electrical contact. This vapor-solid reaction is performed by subjecting a semiconductor structure including a metal present on an area of this semiconductor structure to a silicon comprising precursor gas or a germanium comprising precursor gas. This area exposes at least a part of a contact region.

In preferred embodiments of the third aspect, this contact region is at least a part of a top surface of a source region and/or a drain region.

In preferred embodiments of the third aspect, this metal is nickel.

In preferred embodiments of the third aspect, this vapor-solid reaction is carried out in a temperature range of 215° C. to 350° C.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE FIGURES

FIG. 1b is a flowchart representing a step of the method represented in the flowchart of FIG. 1a.

DETAILED DESCRIPTION OF THE INVENTION

Figure 1A:
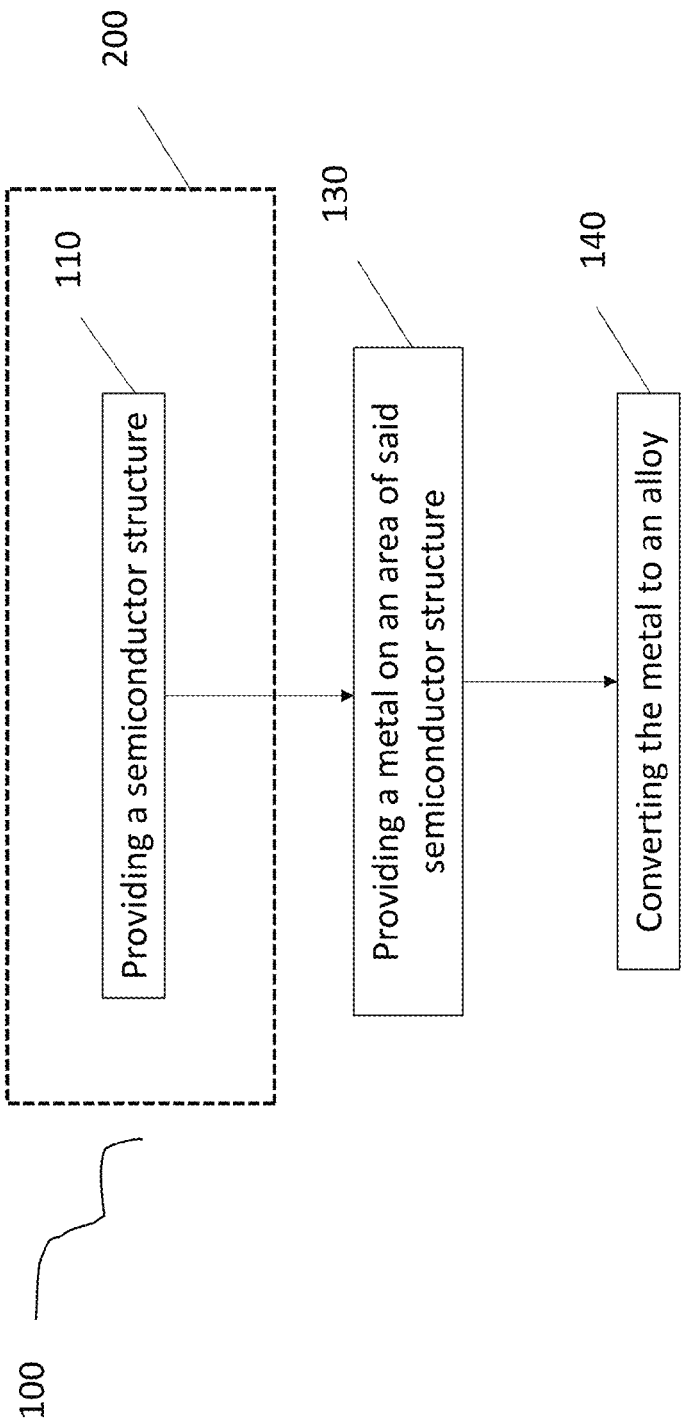
FIG. 1a is a flowchart representing a method according to an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, the term "interface" refers to a surface forming a common boundary between two materials that are in physical contact. In the present invention interface refers to the surface between the electrical contact and the vertical semiconductor body and to the surface between the contact metal and the electrical contact.

As used herein and unless provided otherwise, the term "planar" refers to a surface being flat, e.g. being substantially in two dimensions.

As used herein and unless provided otherwise, the term "sheet resistance" refers to the ratio of the resistivity of a material to its thickness. The unit of sheet resistance is usually taken as Ohms per square denoted as Ohms/sq., which is dimensionally equal to an Ohm, but is used for sheet resistance.

As used herein and unless provided otherwise, the term "front end of line (FEOL)" refers to the first part of IC manufacturing where individual devices such as transistors, capacitors are present on the wafer.

As used herein and unless provided otherwise, the term "back end of line (BEOL)" refers to the second part of IC manufacturing for interconnecting the individual devices, such as transistors, capacitors, present on a wafer. BEOL processing may comprise forming electrical contacts on source and drain regions, depositing a pre-metal dielectric (PMD), planarizing the PMD, forming contact holes in the PMD and providing a contact metal in these contact holes.

As used herein and unless provided otherwise, the term "electrical contact" refers to a contact made on an area of a conducting or a semiconducting material.

FIG. 1a is a flowchart representing a method according to an embodiment of the present invention.

The method (100) starts with (110) providing a semiconductor structure (500). This semiconductor structure comprises a substrate (180).

Thereafter, a metal (250) is provided (130) on an area of this semiconductor structure (500). This metal is, preferably, Ni. Providing (130) this metal (250) on an area of this semiconductor structure (500) typically comprises loading this semiconductor structure into a first tool. Typically, this first tool is a deposition tool. An in-situ pre-treatment is applied in this first tool that is subsequently followed by depositing this metal in the same chamber/tool. This pre-treatment is a dry pre-cleaning treatment. This dry pre-cleaning treatment is a SiCoNi treatment.

This deposition can be done by any suitable deposition technique known to persons skilled in the art while paying attention to the thermal budget for Ni deposition. Any thermal budget in the range 30° C. (Room Temperature) to 200° C. would be ideal to avoid the interaction of Ni with underlying Ge during Ni deposition. Physical vapor deposition (PVD), sputtering or atomic layer deposition (ALD) may be used. More preferably, ALD is used since it provides conformal deposition.

After depositing this metal (250) on an area of this semiconductor structure (500) in this first tool, this semiconductor structure is loaded into a second tool. Typically, this second tool is a deposition tool. This deposition tool may be a chemical vapor deposition (CVD) tool. When this semiconductor structure is placed on the chuck of this deposition tool, there is usually a temperature gradient due to the thickness of the semiconductor structure. Therefore, after loading, a stabilized temperature has to be reached between the chuck and the surface of this semiconductor structure. Thus, a stabilization time in the range of 30 to 60 seconds is required to reach this stabilized temperature.

The inventors have found out that performing a vapor-solid reaction in the second tool (also referred to as vapor-liquid-solid (VLS) growth) converts this metal (250) to this Si-comprising (260) or this Ge-comprising alloy (260). This vapor-solid reaction is performed by subjecting this semiconductor structure including this metal in this second tool, once this stabilized temperature is reached, to a silicon-comprising precursor gas or a germanium-comprising precursor gas. This Si-comprising alloy is mono-nickel-silicide (NiSi). This Ge-comprising alloy is mono-nickel-germanide (NiGe).

In an example the chamber pressure of the second tool is 4.2 Torr. The $GeH_4$ gas is diluted with $H_2$ to 10%. The gas flow rate of $GeH_4/H_2$ is 1700 sccm along with $N_2$ diluent gas which was flown at 1500 sccm that corresponds to germane ($GeH_4$) partial pressure of about 225 mTorr. The chosen $GeH_4$ exposure time (60s) is sufficient enough to convert Ni to NiGe alloy.

This silicon-comprising precursor gas may be, for example, halides of Si ($SiCl_4$, SiBr4, $SiCl_2H_2$), tetraethyl orthosilicate (TEOS), hexamethyldisiloxane (HMDSO), tetraethylsilane, pentamethylsilane, hexamethyldisilane, tetramethylsilane, methylsilane.

Preferably, this silicon-comprising precursor gas is $SiH_4$.

This germanium-comprising precursor gas may be, for example, halides of germanium ($GeCl_4$, $GeF_2$, $GeBr_2$ etc), digermane, trigermane, isobutylgermane, tetramethylgermane.

Preferably, this germanium-comprising precursor gas is $GeH_4$.

The reaction is aided by the interaction of Ni with $GeH_4$ precursor as such or with the decomposed products of $GeH_4$ precursor (for example: $GeH_4 \rightarrow GeH_{(4-x)}+xH$), the contribution of which depends on the processing temperature.

Ni may catalyze the decomposition of each of these Ge-comprising precursors. However, the decomposition temperature may differ due to the fact that germanium is bonded to different H content, halides or to organic compounds having $CH_x$ that can vary the thermal stability and reactivity of the precursor. Furthermore, $CH_x$ bonded precursors may poison the Ni surface by carbon deposition. This can lead to a retardation in NiGe formation by hindering the mobility of both Ni and Ge. The thermal pyrolysis of Ge-organic compound at the higher temperature than the catalytic vapor-solid reaction temperature or at excessive VLS exposure time (at the same temperature) may lead to Ge incorporation (NiGe+Ge) that eventually may increase the sheet resistance of the electrical contact deteriorating the electrical properties.

The use of GeH$_4$, the simplest precursor from Ge family can alleviate the problems associated with the incorporation of halide or carbon impurities as mentioned above. This GeH$_4$ precursor is diluted with H$_2$ to reach 10% GeH$_4$. This 10% GeH$_4$ mixture containing H$_2$ is provided into this second deposition chamber in the presence of a carrier gas. This carrier gas is an inert gas. Ar, He or N$_2$ can be used as carrier gas. The purpose of using carrier gas is to regulate the partial pressure of germane precursor. This carrier gas is, preferably, N$_2$.

This vapor-solid reaction is carried out in a temperature range of 215° C. to 350° C. This temperature range is also indicative of the temperature range of this stabilized temperature.

The inventors have found out that when GeH$_4$ is used as germanium-comprising precursor gas, this vapor-solid reaction is carried out at a temperature in the range of 215° C. to 250° C. Preferably, this temperature is 225° C. This vapor-solid reaction leads to the formation of mono-nickel-germanide, NiGe. It is an advantage of vapor solid reaction that a low resistive, mono-nickel-germanide electrical contact is formed at a temperature of 225° C.

By using a vapor-solid reaction that utilizes a germanium-comprising precursor, preferably GeH$_4$, in the temperature range of 215° C. to 250° C., the selective etch step, which is essential in state-of-the-art salmanide process, is not required anymore and can be omitted. Furthermore, the lower temperature range of this vapor-solid reaction does not jeopardize the thermal budget when manufacturing a semiconductor device and might preserve the mobility of Ge. More advantageously, mono-nickel-germanide phase is obtained in a single step at this temperature range, which is lower than what is used in the state-of-the-art, resulting in an electrical contact having a sheet resistance value lower than 20 Ohms/sq.

The inventors have found out that when SiH$_4$ is used as silicon-comprising precursor gas, this vapor-solid reaction is carried out at a temperature in the range of 225° C. to 350° C. Preferably, this temperature is 325° C.–350° C. This vapor-solid reaction leads to the formation of mono-nickel-silicide, NiSi, electrical contact.

Figure 1B:
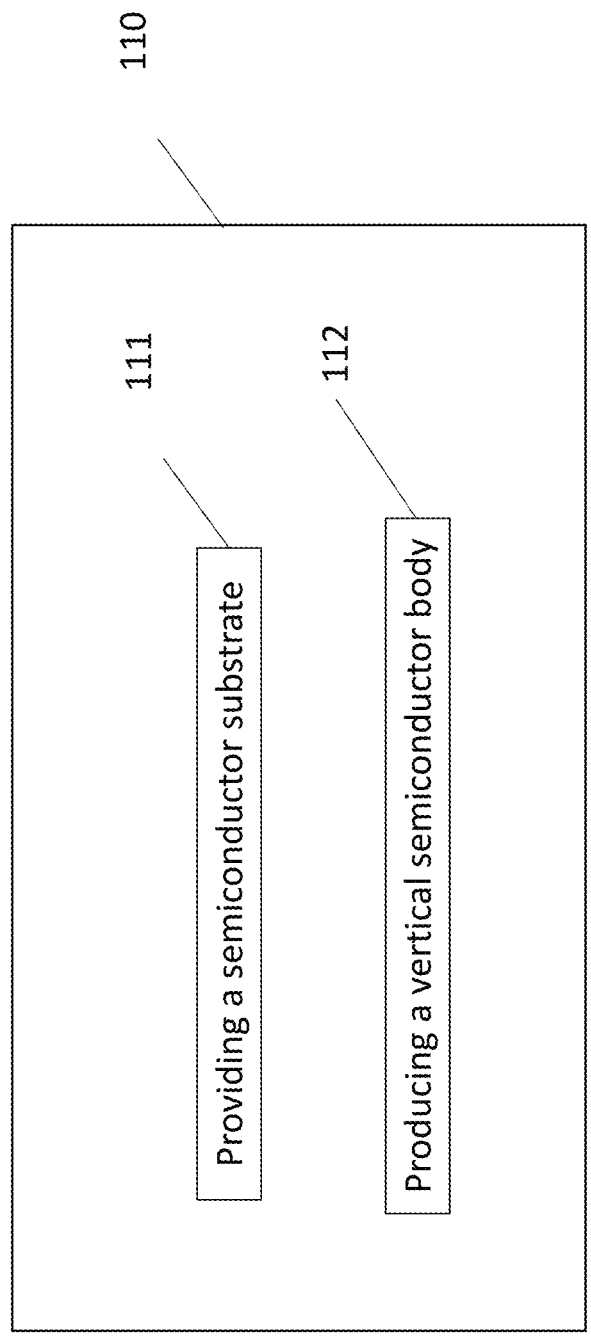

FIG. 1b is a flowchart representing a step of the method represented in the flowchart of FIG. 1a.

The step of providing (110) a semiconductor structure (500) comprises providing (111) a semiconductor substrate (180).

Providing (110) this semiconductor structure (500) further comprises producing (112) a vertical semiconductor body (175) protruding from this semiconductor substrate (180).

In embodiments, this substrate (180) is a bulk Si substrate.

In these embodiments, producing (112) this vertical semiconductor body (175) comprises patterning this bulk Si substrate and etching to, thereby, create free-standing pillars made from this substrate. An insulating layer (170) is deposited and planarized, thereby exposing the top surfaces of these free-standing pillars. This insulating layer is a shallow trench isolation layer (STI). This insulating layer is typically SiO$_2$.

This insulating layer is recessed, thereby revealing the top part of these pillars. This top part is a vertical semiconductor body made from Si. This vertical semiconductor body is a fin structure (175).

Alternatively, after planarizing this insulating layer (170), these free-standing pillars may be recessed, thereby creating a recess exposing this semiconductor substrate (180). This recess is bounded by this insulating material (170). A vertical semiconductor body is, thereby, produced by epitaxially depositing another semiconductor material on a part of this semiconductor substrate that is exposed at bottom of this recess. This epitaxially deposited semiconductor material comprises Si, Ge or a group III-V compound semiconductor. This vertical semiconductor body is a fin structure (175). This vertical semiconductor body comprises Si, Ge or a group III-V compound semiconductor.

In embodiments, where this substrate is a bulk Si substrate, an alternative option exists for producing this vertical semiconductor body. This alternative option comprises depositing epitaxially a semiconductor material on a part of this semiconductor substrate. This epitaxially deposited semiconductor material comprises Si, Ge or a group III-V compound semiconductor. In this alternative option, this part may be a complete (exposed) surface of this semiconductor substrate. Performing a patterning process and subsequently etching this epitaxially deposited semiconductor material, thereby creates this vertical semiconductor body. This vertical semiconductor body is a fin structure (175). This vertical semiconductor body thus, comprises Si, Ge or a group III-V compound semiconductor.

In alternative embodiments, this substrate may be a silicon-on-insulator (SOI) substrate or a germanium-on-insulator (GeOI) substrate comprising a silicon layer or a germanium layer present on an insulating layer, respectively.

In these alternative embodiments, this fin structure is formed from the silicon layer or the germanium layer present on the insulating layer of the SOI or GeOI substrate, respectively by performing patterning and etching processes. Producing this fin structure in these alternative embodiments is known to persons skilled in the art.

Figure 2:
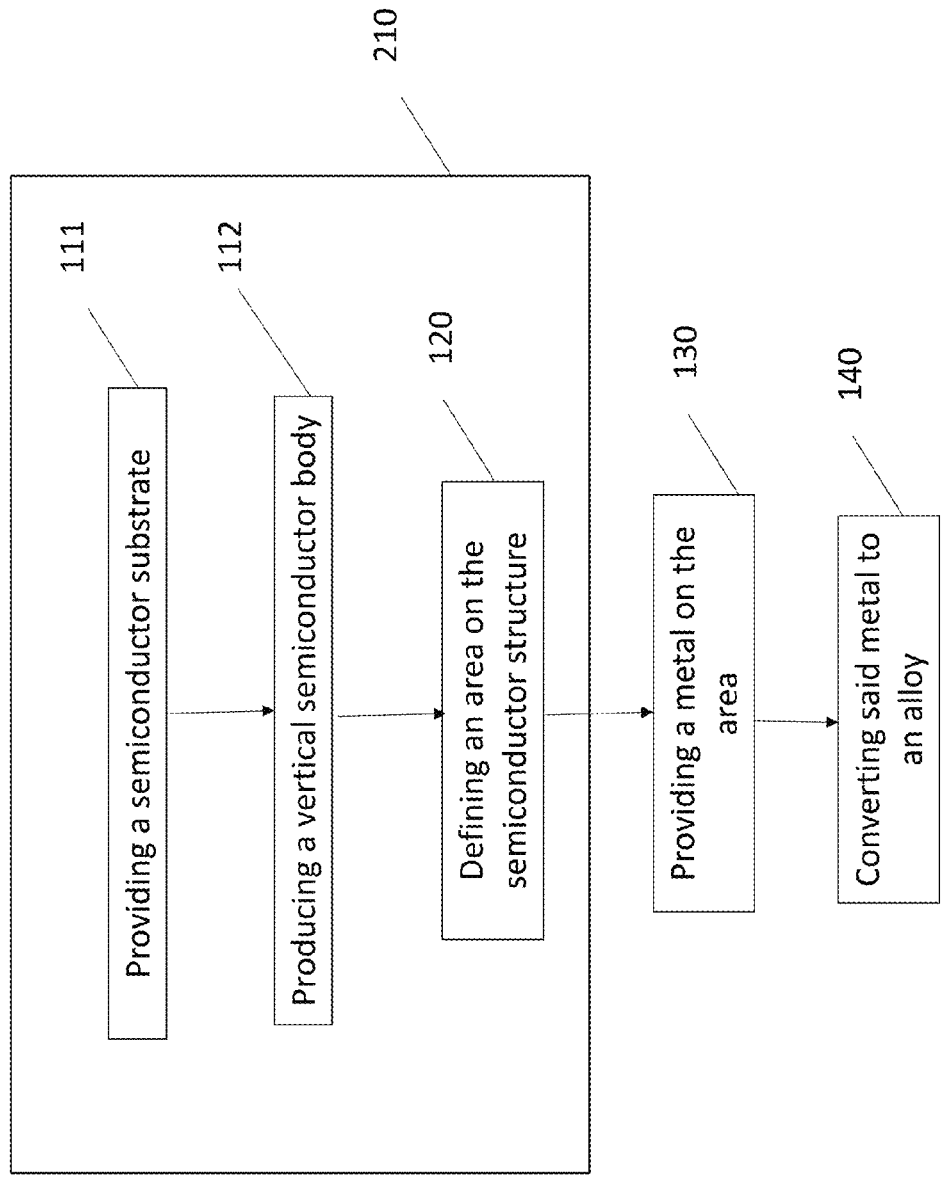
FIG. 2 is a flowchart according to a particular embodiment of the method represented in the flowchart of FIG. 1a, where the step of defining an area on the semiconductor structure is introduced before the step of providing a metal on the area.
Figure 2:
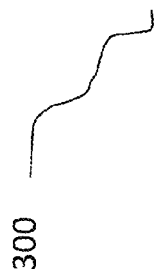

FIG. 2 is a flowchart according to a particular embodiment of the method represented in the flowchart of FIG. 1a. The method (300) starts with a first step (210). This first step (210) comprises the step of providing (111) a semiconductor substrate (180) and the step of producing (112) a vertical semiconductor body (l75) as outlined in FIG. 1b. This first step (210) further comprises defining (120) an area on this semiconductor structure (500).

In embodiments defining an area on this semiconductor structure (500) comprises depositing an insulating layer (170) on this semiconductor structure. This insulating layer is preferably SiO$_2$. This insulating layer may also be referred to as a Pre-Metal Dielectric (PMD). A chemical mechanical planarization step is performed, thereby planarizing the surface of this dielectric and reducing the thickness to a predetermined value. A photoresist is deposited on said semiconductor structure overlying this insulating layer. A lithographic process is performed, thereby creating a patterned photoresist. This lithographic process may be done by Deep UV (DUV), Extreme UV (EUV), Directed Self-Assembly (DSA) or any one of multiple patterning techniques such as Self-Aligned Double Patterning (SADP), Self-Aligned Quadruple Patterning (SAQP), Self-Aligned Triple Patterning (SATP). A subsequent etch process is performed using this patterned photoresist as a mask layer, thereby creating a through-hole (150) through this insulating layer (220). This through-hole is a contact hole (150, 150"). The diameter (y) of this contact hole may be given by y≤x or by y≥(x+2t) where (x) is the spacer-to-spacer distance between two neighboring gate stacks (290) and (t) is the thickness of each spacer (190) present on each side of the gate electrode (160). However, in the latter situation, the diameter (y) of the contact hole (150,150") cannot be that large such that contact holes (150,150") on either side of a gate stack (290) are merged.

This hole opens, at its bottom, to an area (240, 240") of this semiconductor structure (500). This area is located on the top surface of this vertical semiconductor body (175) comprised in this semiconductor structure. This area (240, 240") exposes a semiconductor material and is at least a part of a contact region. This contact region is at least a part of a top surface of a source (280) and/or a drain region (270) comprised on the top part of this vertical semiconductor body (150). This area is a contact area.

Defining this area further comprises removing this patterned photoresist by performing a strip process.

In a second step (130) of the method (300), a metal (250) is provided on this area as outlined in FIG. 1a.

In a third step (140) of the method (300), this metal (250) is converted to an alloy (260) as outlined in FIG. 1a.

Figure 3:
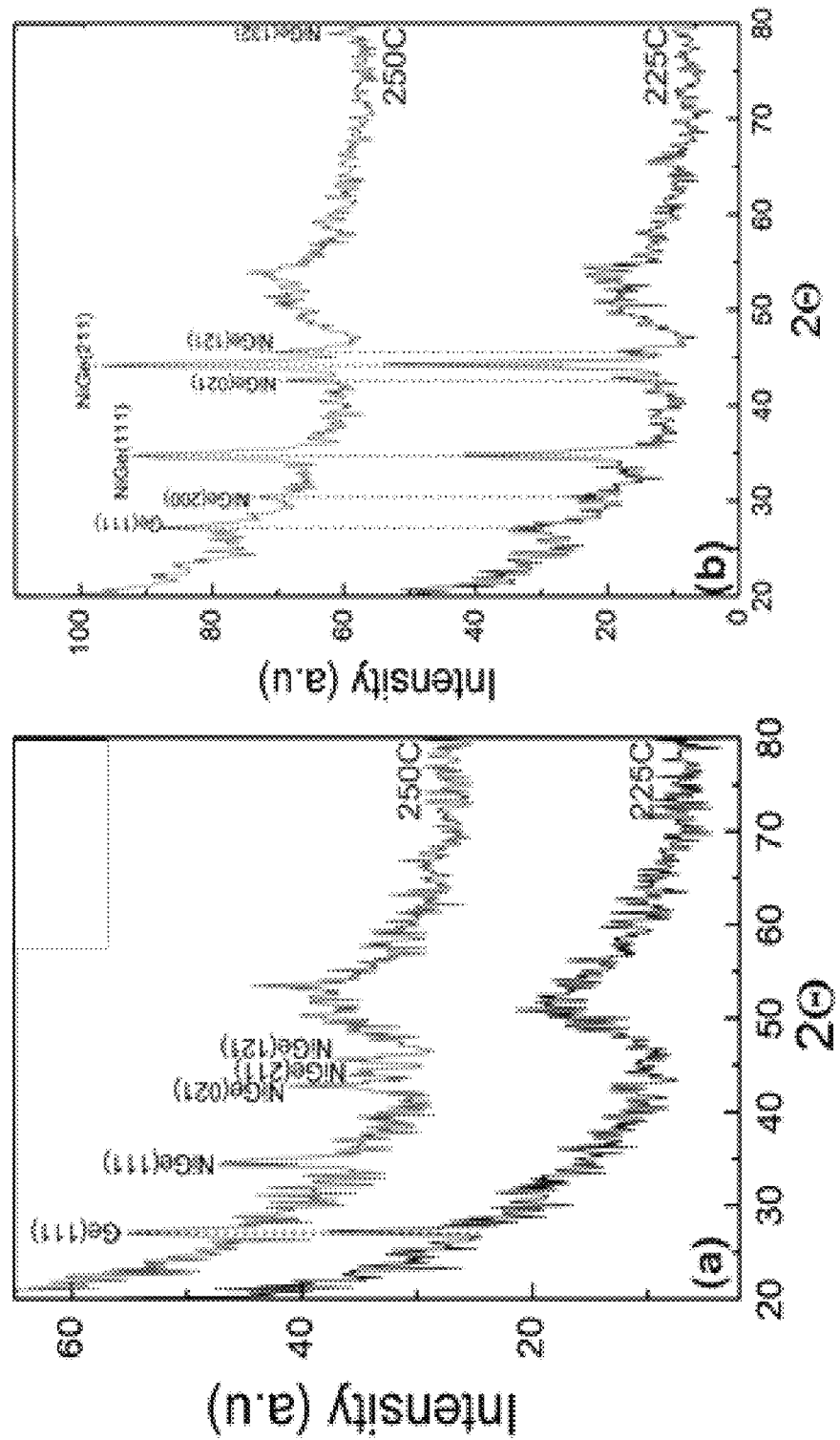
FIG. 3 is Grazing Incidence X-Ray Diffraction (GIXRD) spectra of epitaxial Ge/Ni films that are (a) annealed and (b) GeH$_4$ precursor treated at 225° C. and 250° C., respectively for 60 seconds.

FIG. 3 compares the Grazing Incidence X-Ray Diffraction (GIXRD) spectra of Ni at 225° C. and 250° C. when (a) annealed and (b) subjected to $GeH_4$ precursor. GIXRD spectra confirms that for both the studied temperatures, $GeH_4$ treated Ni films show prominent signatures due to NiGe (FIG. 3, part b) while for the annealed ones only at 250° C., such peaks are observed (FIG. 3, part a). The presence of NiGe peaks at 225° C. for Ni—$GeH_4$ approach, that is lacking for anneal provided samples, clearly confirms that the NiGe formation is due to the chemical reaction between Ni films and $GeH_4$ precursor rather than the self-aligned reaction between Ni and Ge films. At 250° C., though both applied routes results in NiGe formation, sharp reflections for the $GeH_4$ treated ones indicate the enhanced film crystallinity compared to anneal processed films.

Figure 4:
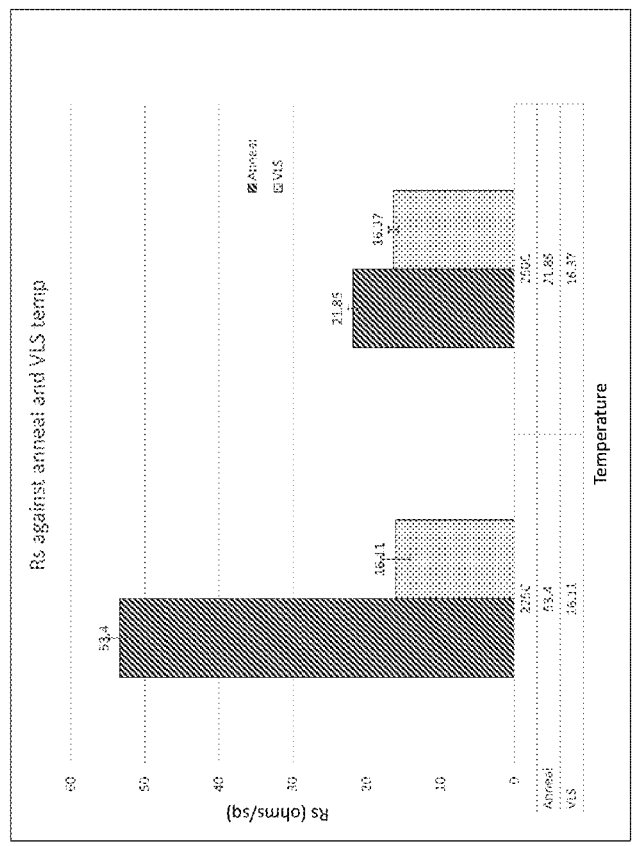
FIG. 4 is a comparison of the sheet resistance ($R_s$) values at 225° C. and 250° C. for Si/epitaxial Ge/Ni stack annealed (tilted texture) and GeH$_4$ exposed (dotted texture).

FIG. 4 is a comparison of the sheet resistance ($R_s$) values at 225° C. and 250° C. for Si/epitaxial Ge/Ni stack annealed (tilted texture) and $GeH_4$ exposed (dotted texture). In aggrement with the GIXRD results, lower Rs values (16.11-16.37 ohms/sq) with good uniformity ($1\sigma=3.9\%$) are obtained only in the case of vapor-solid reaction in support of NiGe formation at 225-250° C. Low Rs values (21.85 ohms/sq) are obtained for the annealed films at 250° C., while at 225° C. increase of Rs values (53.4 ohms/sq) is observed compared to untreated reference Ni (48.97 ohms/sq). Though NiGe is formed at 250° C. in both strategies, Rs data highlight that good film quality, in terms of electrical properties, is possible only via vapor-solid reaction route. Relatively higher Rs (21.85 ohms/sq) values with high non-uniformity ($1\sigma=8.9\%$) is noted for annealed films compared to VLS (16.37 ohms/sq, $1\sigma=3.9$) at 250° C.

Figure 5:
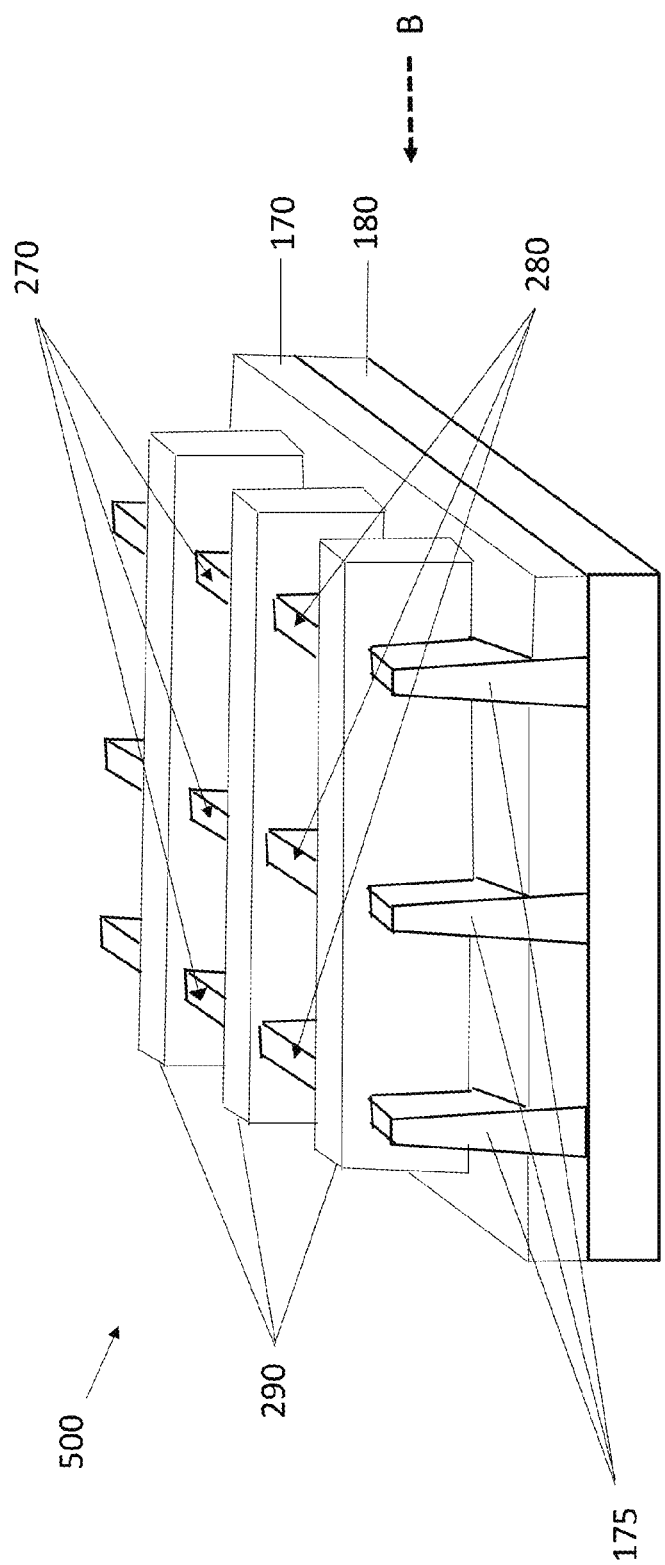
FIG. 5 is a tilted view of a semiconductor structure according to a particular embodiment of the method represented in FIG. 2. (B indicates the direction of front view).

FIG. 5 is a tilted view of a semiconductor structure (500) according to a particular embodiment of the method represented in FIG. 2. This semiconductor structure comprises a substrate (180). This substrate is a bulk Si substrate. An insulating layer (170) is present on this semiconductor substrate (180). This insulating layer, is an STI layer and is, preferably, $SiO_2$. A vertical semiconductor body (175) protrudes from this semiconductor substrate. This vertical semiconductor body is a fin structure. This semiconductor structure (500) further comprises a (plurality of) gate stack(s) (290). This gate stack comprises a gate dielectric (not shown in the figures), a gate electrode (160) and (optionally) a gate cap (230). This gate dielectric conformally covers this fin structure. This gate electrode (160) is deposited directly on this gate dielectric and wraps around this fin structure (175). This gate cap, when present, is directly on this gate electrode. Choices suitable to be used as the gate dielectric, the gate electrode (160) are known to persons skilled in the art. This gate stack is sandwiched between insulating spacers (190). This gate cap (230) and insulating spacers (190) may be made from $Si_3N_4$, SiON, SiN or SiC.

FIGS. 6a to 6d show front view (as seen from direction B in FIG. 5) of the semiconductor structure (500) represented in FIG. 5 according to a particular embodiment of the method represented in the flowchart of FIG. 2.

Figure 6A:
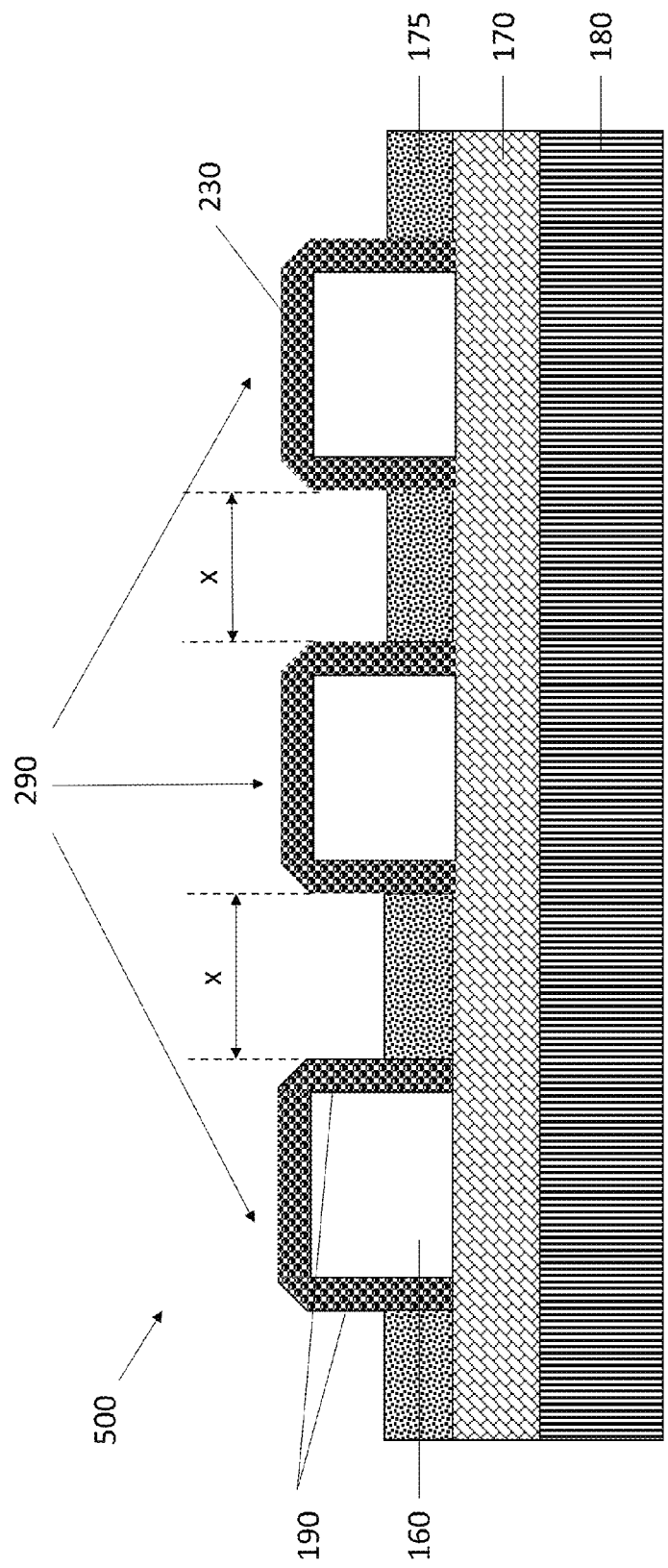
FIGS. 6a to 6d show front view of the semiconductor structure represented in FIG. 5 according to a particular embodiment of the method represented in the flowchart of FIG. 2.

FIG. 6a shows the front view of this semiconductor structure (500) as presented in FIG. 5.

This semiconductor structure (500) comprises a substrate (180). An insulating layer (170) is present on this semiconductor substrate. A fin structure (175) protrudes from this semiconductor substrate. This semiconductor structure further comprises plurality of gate stacks (290). Each gate stack comprises a gate electrode (160) and spacers (190) on its lateral sides and a gate cap (230) on its top surface. Spacer-to-spacer distance between two adjacent gate stacks (290) is designated by "x".

Figure 6B:
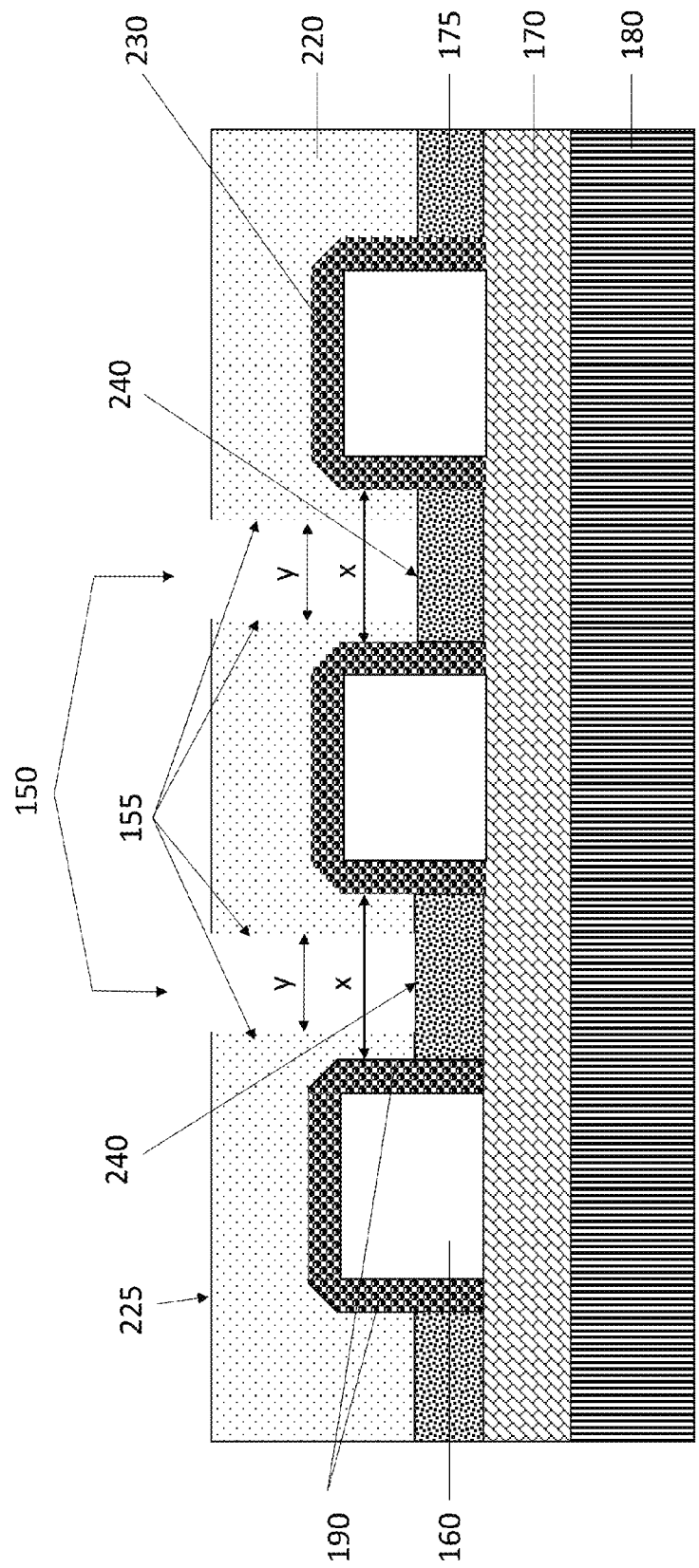

FIG. 6b shows the front view of this semiconductor structure (500) after an area (240) has been defined on this semiconductor structure as represented by step (120) of FIG. 1a and FIG. 2.

This area (240) exposes at least a part of a contact region comprised on a top surface of a vertical semiconductor body (175). This contact region is at least a part of a top surface of a source region (280) and/or a drain region (270). This area is exposed at the bottom of a through-hole (150) formed through this insulating layer (220). This insulating layer (220) is provided on this semiconductor structure (500). This through-hole is a contact hole. The diameter (y) of this contact hole is smaller than the spacer-to-spacer distance (x) between two neighboring gate stacks (290). This area (240) is a contact area located on the top surface of this vertical semiconductor body (175) comprised in this semiconductor structure (500). This semiconductor body (175) is a fin structure. An epi layer may be present on source region (280) and drain region (270). This epi layer may be an epitaxially grown Si layer or an epitaxially grown SiGe layer. In this case, this area (240) may be sloped.

This through-hole has side walls (155) that bound this area (240). These side walls expose a part of at least one insulating material. This exposed part of this at least one insulating material is the insulating layer (220).

Figure 6C:
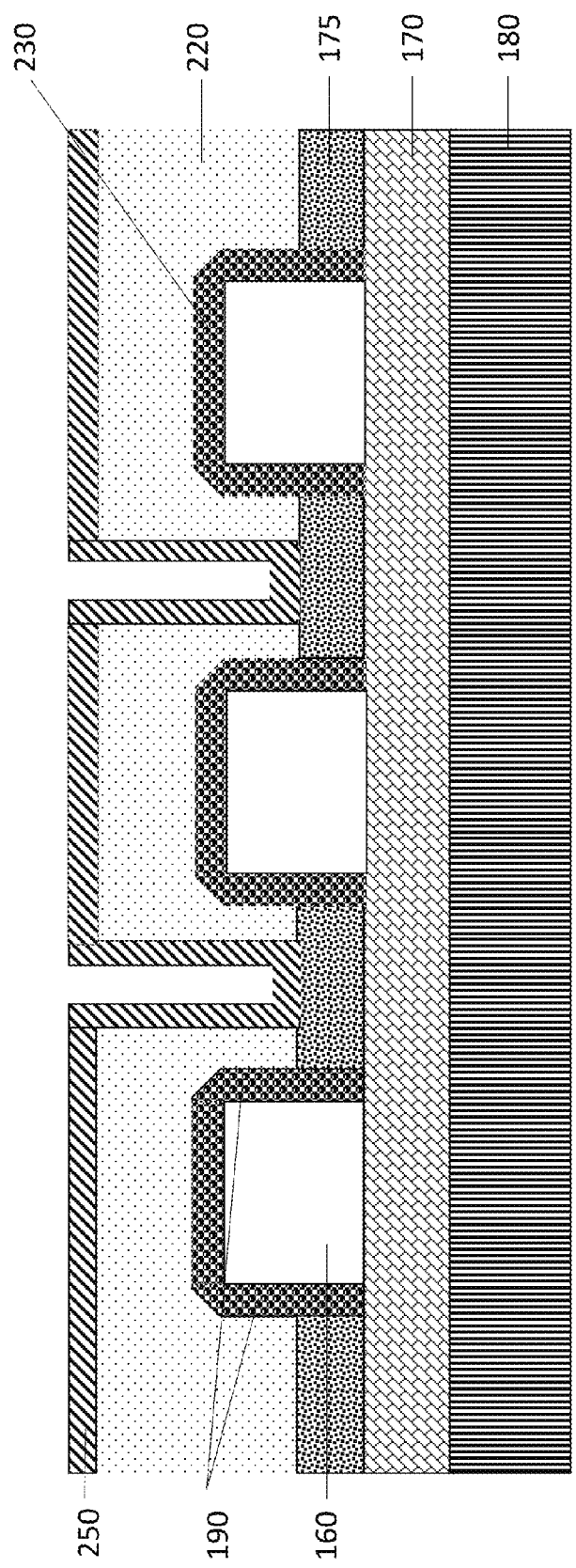

FIG. 6c shows the front view of this semiconductor structure (500) after a metal layer (250) is provided at least on this area (240) of this semiconductor structure (500), in the first tool, as represented by step 130 of FIG. 1a and FIG. 2. As shown in this figure, this metal layer (250) is also provided on the exposed top surface (225) of this insulating layer (220) and on the side walls (155) of this through-hole (150). This metal is Ni.

Alternatively, this metal may also be selectively provided only on this area (240) that exposes at least a part of a source (280) region and/or a drain region (270) comprised on the top surface of this vertical semiconductor body (175).

Exposing this semiconductor structure (500) after Ni deposition, to a Si or Ge comprising precursor gas, in the second tool, converts Ni into a Si or Ge comprising alloy. This Si or Ge comprising alloy is a mono-nickel silicide or a mono-nickel-germanide (260). When this metal layer (250) is also provided on the exposed top surface (225) of this insulating layer (220) and on the side walls (155) of this through-hole (150), conversion of this metal into this Si comprising alloy or this Ge comprising alloy results in a continuous layer.

On top of this mono-nickel-silicide or mono-nickel-germanide, another metal may be provided on this area of this semiconductor structure. It may also be a stack comprising several metals that are present for different purposes such as adhesion, to act as barrier or for tuning the work function.

Figure 6D:
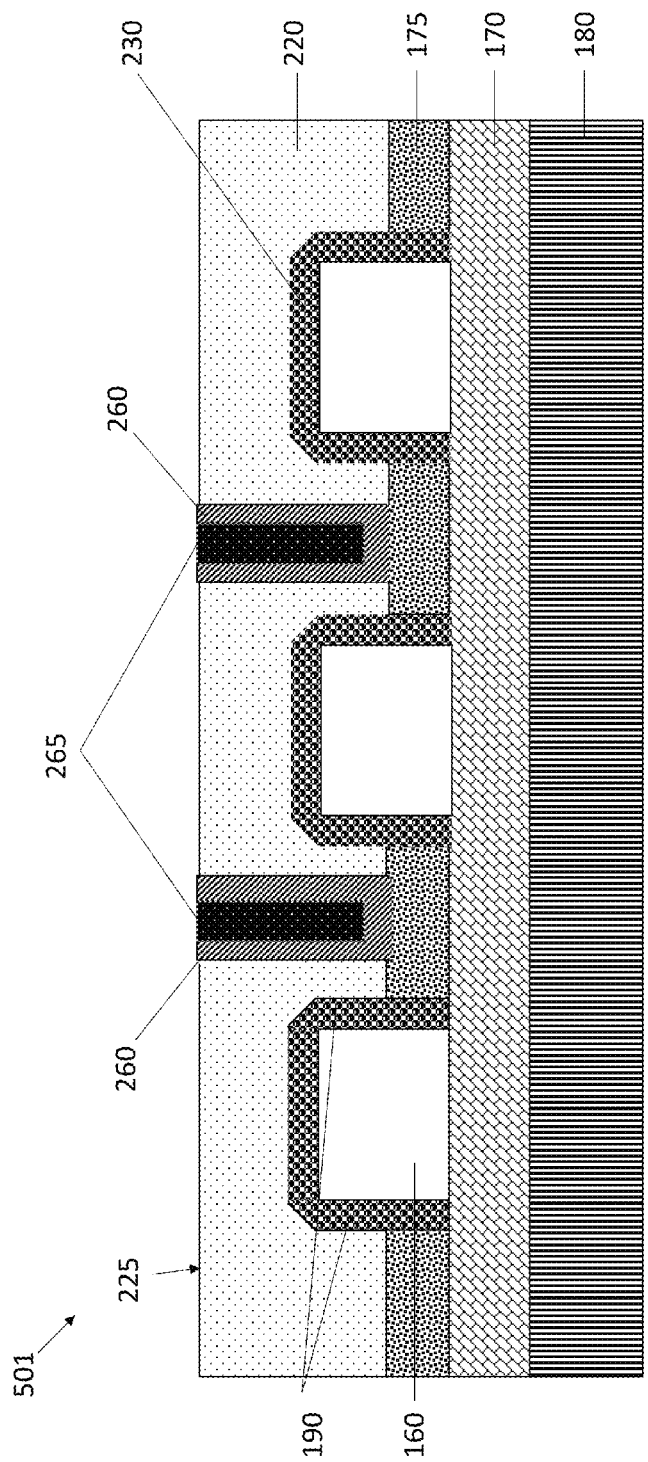

FIG. 6d shows a semiconductor device (501) obtained after contact fill metal (265) deposition and subsequently, a planarization step has been performed on this semiconductor structure (500). This contact metal (265) may be tungsten, copper, aluminum, cobalt or another low resistive metal that can be applied in a similar way.

This planarization step is a chemical mechanical planarization (CMP) step. This CMP step is performed until an end point is reached, whereby this Si or Ge comprising alloy (260) has been removed to, thereby, expose a top surface (225) of this insulating layer (220). This Ge comprising alloy is a mono-nickel-germanide (NiGe). This Si comprising alloy is a mono-nickel-silicide (NiSi).

An electrical contact is thus, formed on an area (240) of this semiconductor structure (500). At the bottom of this through-hole (150) this electrical contact has an upper interface with this contact metal (265) and a lower interface with this vertical semiconductor body (175) on this area (240). This lower interface is a planar interface. The thickness variation of this electrical contact between this upper interface and this lower interface is less than <1 nm.

In the case where there may be an epitaxially grown Si layer or an epitaxially grown SiGe layer on the source region (280) and drain region (270) that results in a sloped area, this electrical contact still has a planar interface with this sloped area. The thickness variation of this electrical contact between this upper interface and this lower interface on this sloped area is less than 1 nm.

Figure 7A:
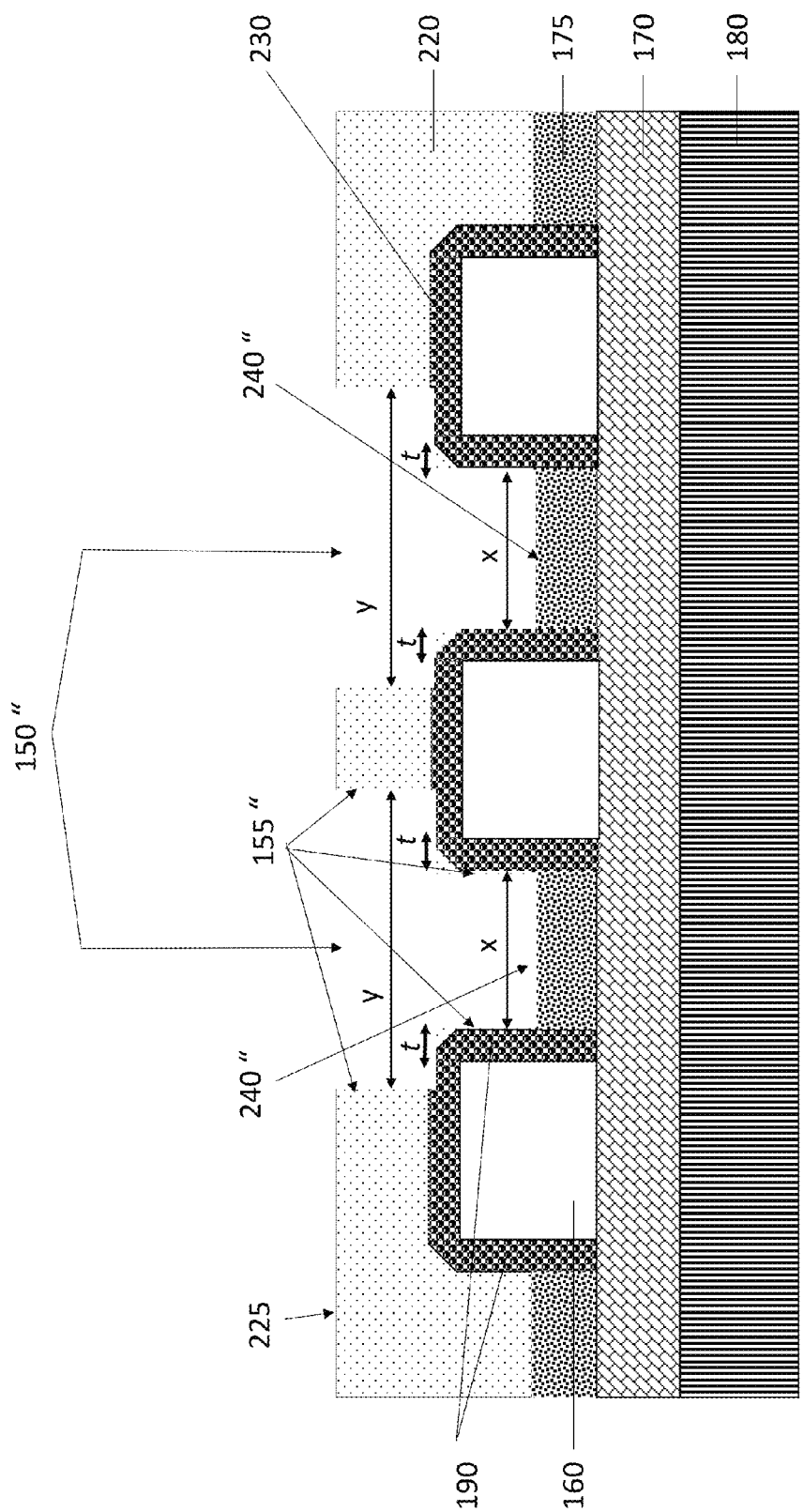
FIGS. 7a and 7b show front view of the semiconductor structure represented in FIG. 5 according to an alternative embodiment of the method represented in the flowchart of FIG. 2.
Figure 7B:
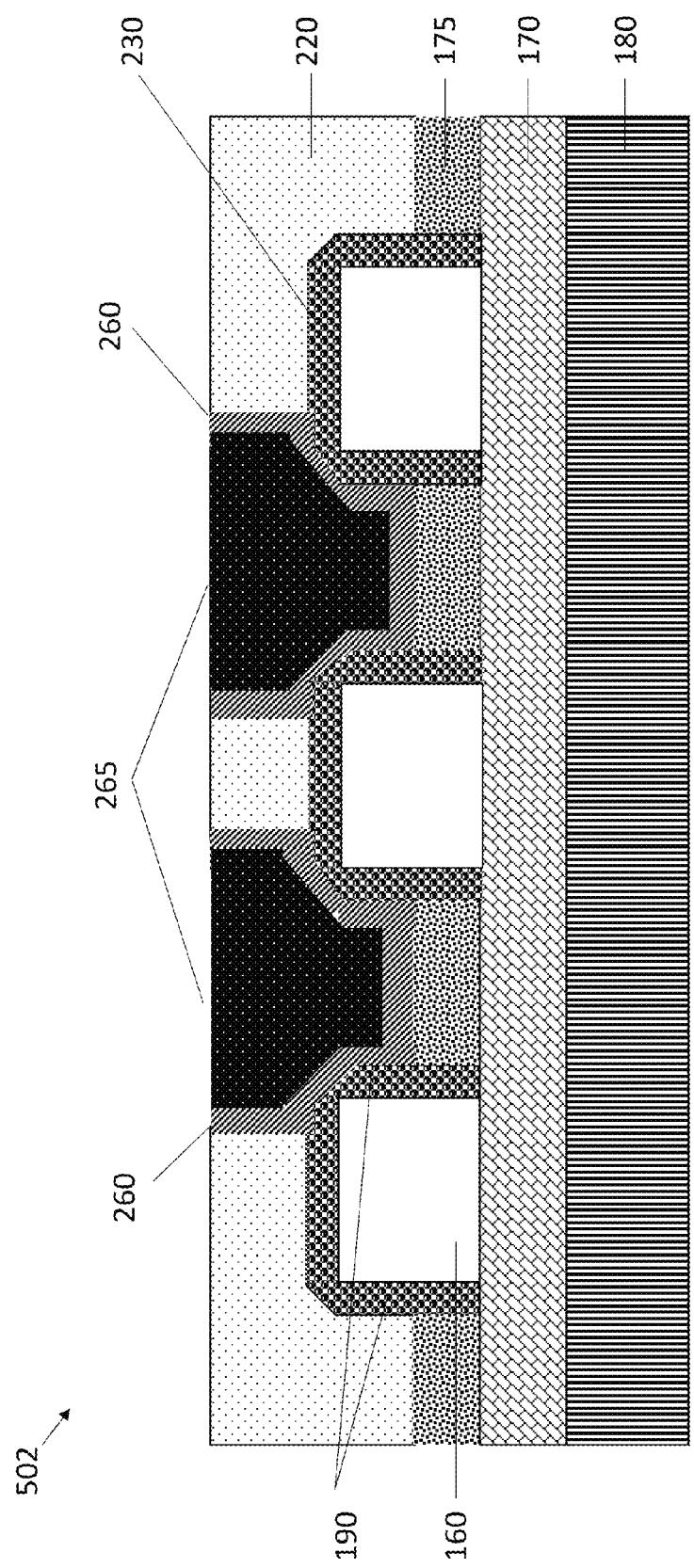

FIGS. 7a and 7b show front view of the semiconductor structure (500) represented in FIG. 5 according to an alternative embodiment of the method represented in the flowchart of FIG. 2.

In this alternative embodiment, as shown in FIG. 7a, the lithography and etch process used within the step (120) of defining an area on the semiconductor structure results in obtaining (through-holes) contact holes (150") having diameter (y) that is larger than the summation of spacer-to-spacer distance (x) between two neighboring gate stacks (290) and the total spacer thickness (2t) on both sides of this area (240"). Even though the diameter of the contact hole (150") is larger than the summation of the spacer-to-spacer distance (x) between two neighboring gate stacks (290) and the total spacer thickness (2t) on both sides of this area (240"), the diameter (y), in this case, cannot be that large such that contact holes (150") on either side of a gate stack (290) are merged.

In this alternative embodiment, this contact hole (150") opens at its bottom to this area (240"), where this area exposes the complete contact region present between two neighboring gate stacks (290) having a spacer-to-spacer (x) separation distance. This contact region is, then, the complete top surface of the source region (280) and/or drain region (270) present on the top part of this vertical semiconductor body (175). This vertical semiconductor body is a fin structure and this area (240") is a contact area.

This area (240") is bounded by sidewalls (155"). These sidewalls expose the insulating spacers (190). These exposed insulating spacers (190) are those that are present and face each other on opposite sides of two neighboring gate stacks (290). These sidewalls (155") of the contact hole (150") further expose this insulating layer (220).

Ni (250) is provided conformally in the first tool covering the top surface (225) of this insulating layer (220), sidewalls (155") of this through-hole and this contact area (240")

In this alternative embodiment shown in FIG. 7a, providing (130) this metal (250), which is Ni, as represented in flowchart according to FIG. 2 may also be done in a selective way to result in Ni being present only on this area (240").

After subjecting Ni to a Si comprising precursor gas or a Ge comprising precursor gas in the second tool, Ni (250) is converted into a Si comprising or a Ge comprising alloy (260). This Ge comprising alloy is a mono-nickel-germanide (NiGe). This Si comprising alloy is a mono-nickel-silicide (NiSi).

FIG. 7b, shows a semiconductor device (502) obtained after contact fill metal (265) deposition and subsequently, a planarization step has been performed on this semiconductor structure (500) presented in FIG. 7a.

An electrical contact is formed on an area (240") of this semiconductor structure (500). At the bottom of this through-hole (150") this electrical contact has an upper interface with this contact metal (265) and a lower interface with this vertical semiconductor body (175) on this area (240"). This lower interface is a planar interface. The thickness variation of this electrical contact between this upper interface and this lower interface is less than <1 nm.

Alternatively (not shown in the figures), the lithography and etch process used within the step (120) of defining an area on the semiconductor structure may result in obtaining (through-holes) contact holes having diameter (y) that is equal to the spacer-to-spacer distance (x) between two neighboring gate stacks.

Yet alternatively, the lithography and etch process used within the step (120) of defining an area on the semiconductor structure may result in obtaining contact holes having diameter (y) that is equal to the summation of spacer-to-spacer distance (x) between two neighboring gate stacks and the total spacer thickness (2t) on both sides of this horizontal portion.

Figure 8:
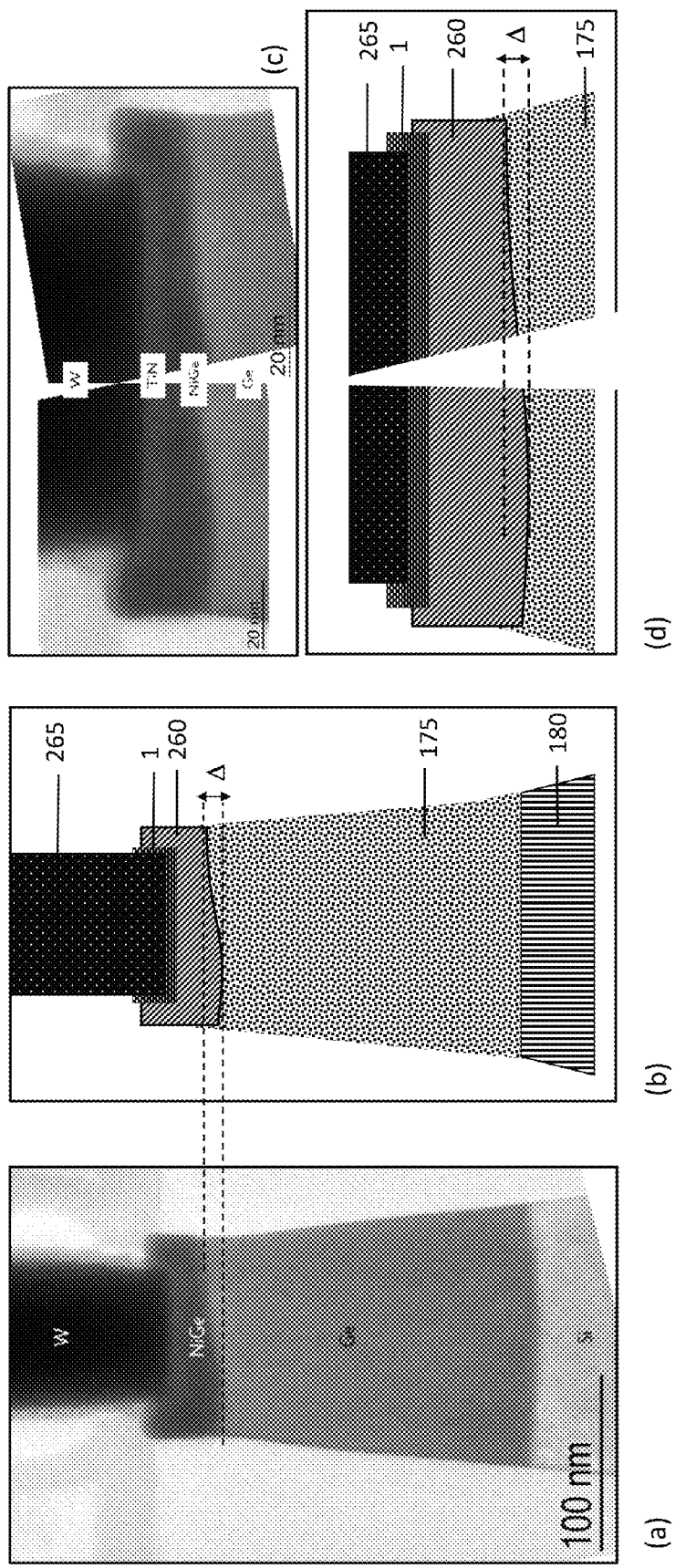
FIG. 8 shows parts (a) and (c) as a Transmission Electron Microscopy (TEM) image of a NiGe electrical contact produced by the state-of-the-art salmanide reaction and parts (b) and (d) are sketches of the TEM images shown in parts (a) and (d), respectively.

Parts (a) and (c) of FIG. 8 show Transmission Electron Microscopy (TEM) images of a mono-nickel-germanide (NiGe) electrical contact produced by the state-of-the-art salmanide process. Parts (b) and (d) of FIG. 8 are sketches of the TEM image presented in parts (a) and (b) of FIG. 8, respectively. This NiGe electrical contact (260) is formed on a fin structure (175) made of Ge on Si substrate (180). A contact metal (265), which is tungsten (W), is deposited on this NiGe electrical contact (260). It is noted that due to the non-uniform reaction between the deposited nickel and germanium, the interface between NiGe and Ge is not planar. Ni has reacted more with Ge on the left side of the fin structure (175) compared to the right side, thereby leading to the formation of a non-planar interface between NiGe and Ge. This has led to a thickness variation of (indicated by "Δ" in parts (b) and (d) in FIG. 8 in the range of 10-15 nm of this NiGe/Ge interface between the left and the right side of the fin structure (175). A TiN layer (1) may be present between NiGe electrical contact (260) and W contact metal (265).

Advantageously, the method described may be particularly suited for producing NiGe or NiSi electrical contacts to be used in an integrated circuit comprising multiple n-MOS and p-MOS transistors. This is because the method described simplifies the electrical contact formation process since NiGe or NiSi electrical contacts can be formed simultaneously on n-MOS and p-MOS transistors thanks to the advantage that NiGe or NiSi formation, by the method described, is independent of the material onto which Ni is provided.

Alternatively, if, this p-MOS and this n-MOS transistor or plurality of n-MOS and p-MOS transistors is/are desired to have different electrical contacts, for example NiGe on p-MOS transistor and NiSi on n-MOS transistor or an opposite combination, then after Ni deposition, a protective layer is deposited on this semiconductor structure. This protective layer may be SiO2, SiN, amorphous carbon or other hard mask. This protective layer is patterned and etched, thereby, leaving this protective layer (only) on a second transistor area and exposing a first transistor area. This first transistor area is a p-MOS transistor area. This second transistor area is a n-MOS transistor area. Subjecting this semiconductor structure to a Ge comprising precursor gas at a temperature in the range of 215° C. to 250° C. forms NiGe electrical contact on this first transistor area. Thereafter, this protective layer is removed from this second transistor area. Then, this semiconductor structure is subjected to a Si comprising precursor gas at a temperature in the range of 225° C. to 350° C., to thereby form NiSi electrical contact on this second transistor area.

Alternatively, after removing this protective layer from second transistor area and before subjecting this semiconductor structure to this Si comprising precursor gas, this first transistor area having NiGe electrical contact may be coated with this protective layer. Coating with this protective layer comprises depositing this protective layer, patterning and etching to thereby leave this protective layer on this first transistor area having NiGe electrical contact. This semiconductor structure is then subjected to this Si comprising precursor gas. This forms NiSi electrical contact on this second transistor area.

The invention claimed is:

1. A method for forming an electrical contact to a semiconductor structure, the method comprising:
    providing a semiconductor structure;
    providing a metal on an area of said semiconductor structure, wherein said area exposes a semiconductor material and is at least a part of a contact region; and
    converting said metal to a Si-comprising or a Ge-comprising alloy, thereby forming said electrical contact on said area,
wherein said converting is done by performing a vapor-solid reaction, whereby said semiconductor structure including said metal is subjected to a silicon-comprising precursor gas or a germanium-comprising precursor gas.

2. The method according to claim 1, wherein said metal is nickel.

3. The method according to claim 1, wherein said vapor-solid reaction is carried out at a temperature in the range of 215° C. to 350° C.

4. The method according to claim 3, wherein said vapor-solid reaction is carried out at a temperature in the range of 215° C. to 250° C.

5. The method according to claim 4, wherein said germanium-comprising precursor is $GeH_4$.

6. The method according to claim 3, wherein said vapor-solid reaction is carried out at a temperature in the range of 225° C. to 350° C.

7. The method according to claim 6, wherein said silicon-comprising precursor is $SiH_4$.

8. The method according to claim 1, wherein said providing said semiconductor structure further comprises:
    producing a vertical semiconductor body protruding from said semiconductor substrate, wherein said vertical semiconductor body has a top surface and comprises said contact region on said top surface and wherein the method further comprises, before providing said metal, defining said area on said semiconductor structure.

9. The method according to claim 8, wherein said producing said vertical semiconductor body comprises depositing epitaxially a semiconductor material on a part of said semiconductor substrate.

10. The method according to claim 9, wherein said epitaxially deposited semiconductor material comprises Si, Ge or a Group III-V compound semiconductor.

11. The method according to claim 1, wherein said area exposes said semiconductor material at the bottom of a through-hole in an insulating layer and the method further comprises, after converting said metal, providing a contact metal in said through-hole.

12. The method according to claim 11, wherein said electrical contact has an upper interface with said contact metal and a lower interface, on said area, with said vertical semiconductor body and wherein said lower interface is planar and the thickness variation of said electrical contact between said upper interface and said lower interface is less than 1 nm.

13. The method according to claim 1, wherein said electrical contact is a NiGe or NiSi electrical contact.

14. The method according to claim 1, further comprising pre-treating the semiconductor structure prior to providing said metal.

15. The method according to claim 14, wherein said pre-treatment is a SiCoNi treatment.

16. The method according to claim 1, wherein said semiconductor material is InGaAs, GaAs or InAs.

17. The method according to claim 1, wherein the silicon-comprising precursor gas comprises a silicon halide, tetraethyl orthosilicate, hexamethyldisiloxane, tetraethylsilane, pentamethylsilane, hexamethyldisilane, tetramethylsilane, or methylsilane.

18. The method according to claim 1, wherein the germanium-comprising precursor gas comprises a germanium halide, digermane, trigermane, isobutylgermane, or tetramethylgermane.

* * * * *